US012702021B2

(12) United States Patent     (10) Patent No.:   US 12,702,021 B2

Murugan et al.     (45) Date of Patent:    Aug. 4, 2026

(54) SUBSTRATE-ON-DIE PACKAGE ARCHITECTURE

(71) Applicant: TEXAS INSTRUMENTS INCORPORATED, Dallas, TX (US)

(72) Inventors: Rajen Murugan, Dallas, TX (US); Yiqi Tang, Allen, TX (US); Sylvester Ankamah-Kusi, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 608 days.

(21) Appl. No.: 18/161,451

(22) Filed: Jan. 30, 2023

(65) Prior Publication Data

US 2024/0258212 A1     Aug. 1, 2024

(51) Int. Cl.
| | |
|---|---|
| *H10W 70/40* | (2026.01) |
| *H10W 72/00* | (2026.01) |
| *H10W 72/50* | (2026.01) |
| *H10W 74/01* | (2026.01) |
| *H10W 74/10* | (2026.01) |
| *H10W 90/00* | (2026.01) |

(52) U.S. Cl.
CPC ....... *H10W 70/481* (2026.01); *H10W 74/016* (2026.01); *H10W 74/129* (2026.01); *H10W 72/07554* (2026.01); *H10W 72/536* (2026.01); *H10W 72/5363* (2026.01); *H10W 72/5434* (2026.01); *H10W 72/547* (2026.01); *H10W 90/728* (2026.01); *H10W 90/755* (2026.01); *H10W 90/758* (2026.01)

(58) Field of Classification Search
None
See application file for complete search history.

(56) References Cited

U.S. PATENT DOCUMENTS

| | | | | |
|---|---|---|---|---|
| 5,428,840 A | * | 6/1995 | Sadhir | H03D 9/0633 |
| | | | | 455/333 |
| 8,072,770 B2 | * | 12/2011 | Kummerl | H01L 23/49551 |
| | | | | 361/772 |
| 8,409,978 B2 | * | 4/2013 | Pagaila | H01L 24/49 |
| | | | | 438/611 |
| 2007/0096284 A1 | * | 5/2007 | Wallace | H01L 23/49575 |
| | | | | 257/E23.038 |

(Continued)

FOREIGN PATENT DOCUMENTS

| | | | | | |
|---|---|---|---|---|---|
| CN | 101673723 A | * | 3/2010 | | H01L 24/49 |
| CN | 107946282 A | * | 4/2018 | | H01L 21/76885 |

(Continued)

*Primary Examiner* — Michael Lebentritt

(74) *Attorney, Agent, or Firm* — Ronald O. Neerings; Frank D. Cimino

(57) ABSTRACT

A packaged semiconductor device includes a lead frame and a semiconductor die. The semiconductor die has first and second opposing sides, and the first side of the die is mounted to the lead frame. A first set of bond wires and/or bump bonds are configured to electrically couple the die to the lead frame. A passive circuit element is on a substrate, and the substrate is mounted to the second side of the die. A second set of bond wires and/or bump bonds are configured to electrically couple the passive circuit element to the die. A molding material is configured to encapsulate the passive circuit element, the die, and at least a portion of the lead frame.

21 Claims, 14 Drawing Sheets

(56) References Cited

U.S. PATENT DOCUMENTS

| | | | | |
|---|---|---|---|---|
| 2007/0108583 A1* | 5/2007 | Shim | ..................... | H01L 25/105 |
| | | | | 257/E25.023 |
| 2007/0181908 A1* | 8/2007 | Otremba | ................. | H01L 24/49 |
| | | | | 257/107 |
| 2008/0017960 A1* | 1/2008 | Camacho | ................ | H01L 25/03 |
| | | | | 257/678 |
| 2008/0171402 A1* | 7/2008 | Karnezos | ................ | H01L 25/03 |
| | | | | 257/E21.531 |
| 2009/0302452 A1* | 12/2009 | Camacho | ............. | H01L 21/568 |
| | | | | 257/E23.079 |
| 2010/0001363 A1* | 1/2010 | Frye | ........................ | H01L 23/60 |
| | | | | 257/491 |
| 2014/0091465 A1* | 4/2014 | Hayata | ............. | H01L 23/49548 |
| | | | | 174/536 |
| 2018/0096922 A1* | 4/2018 | Chen | ................. | H01L 23/49551 |
| 2020/0075441 A1* | 3/2020 | Kim | ..................... | H01L 21/565 |
| 2021/0408979 A1* | 12/2021 | Komposch | ............. | H03F 3/195 |
| 2022/0028766 A1* | 1/2022 | Lictao, Jr. | .............. | H01L 24/48 |
| 2022/0037464 A1* | 2/2022 | Zhao | ....................... | H01L 24/06 |
| 2023/0136784 A1* | 5/2023 | Poddar | ................ | H01L 21/4839 |
| | | | | 257/676 |
| 2023/0343683 A1* | 10/2023 | Hooper | ................... | H01L 21/56 |

FOREIGN PATENT DOCUMENTS

| | | | | | | |
|---|---|---|---|---|---|---|
| CN | 110301042 A | * | 10/2019 | ............. | H01L 24/49 |
| KR | 20080098336 A | * | 11/2008 | ............. | H01L 25/50 |
| KR | 20120028846 A | * | 3/2012 | ......... | H01L 23/3128 |
| TW | 1385774 B | * | 2/2013 | | |
| WO | WO-2006018671 A1 | * | 2/2006 | ............. | H01L 24/49 |

* cited by examiner

300

302

304

300

302

304

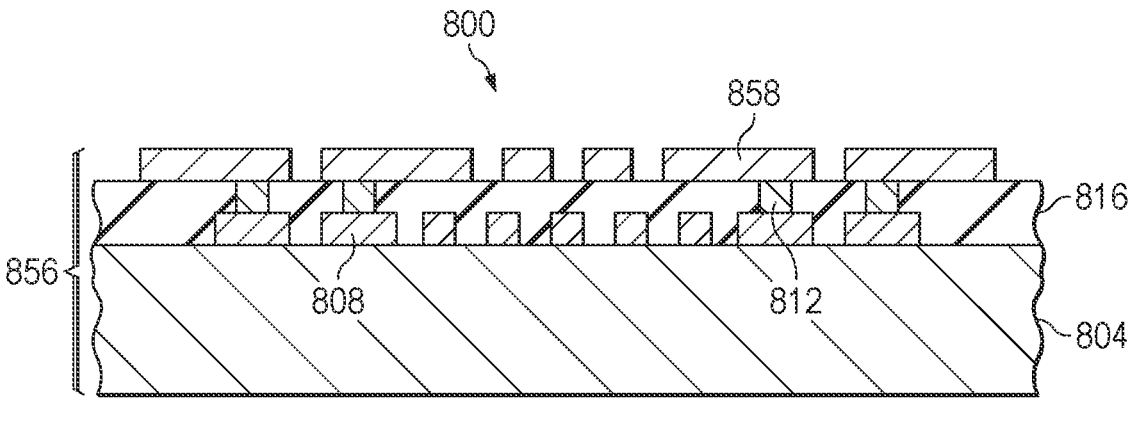
FIG. 8G
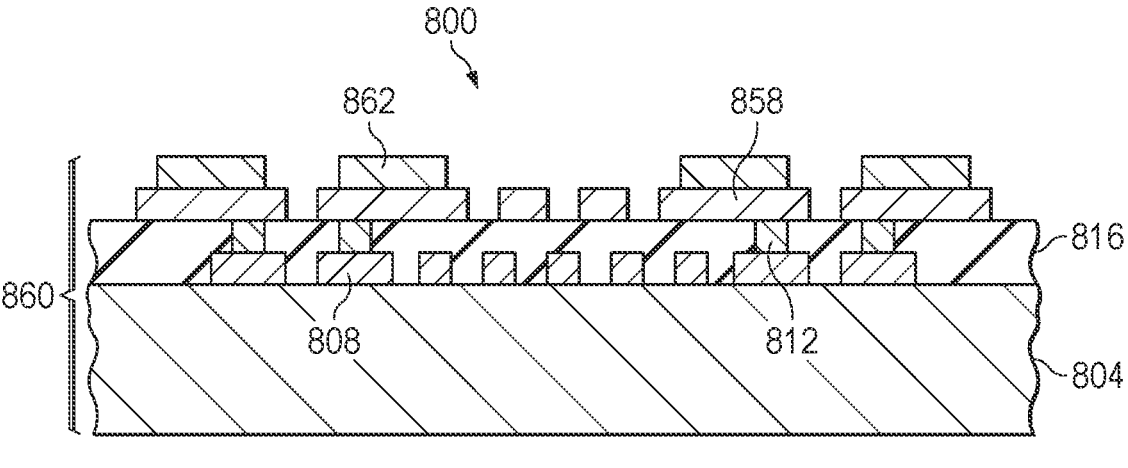
FIG. 8H
FIG. 8I

900

| | |
|---|---|
| 902 | FABRICATE PASSIVE DEVICE ON A SUBSTRATE |
| 904 | MOUNT PASSIVE DEVICE TO FIRST SIDE OF SEMICONDUCTOR DIE |
| 906 | MOUNT SEMICONDUCTOR DIE TO A LEAD FRAME AT SECOND SIDE OF SEMICONDUCTOR DIE |
| 908 | ELECTRICALLY COUPLE PASSIVE DEVICE, DIE, AND LEAD FRAME |
| 910 | ENCAPSULATE PASSIVE DEVICE, DIE, AND AT LEAST A PORTION OF THE LEAD FRAME IN A MOLDING MATERIAL |

1000

SUBSTRATE-ON-DIE PACKAGE ARCHITECTURE

TECHNICAL FIELD

This description relates generally to electronic circuits, and more particularly to a substrate-on-die package architecture, such as using passive circuitry.

BACKGROUND

In electric or electronic circuitry, a passive element is a component that dissipates electrical energy, absorbs electrical energy, or stores electrical energy in an electric or magnetic field. Passive elements do not provide gain or amplification and thus do not require a separate source of electrical power to operate.

A lead frame is a structure inside an integrated circuit (IC) package that carries signals from an IC die inside the package to the outside of the package. A lead frame can include, for example, a central die pad, upon which the die is glued or soldered. The lead frame also has bond pads, where bond wires are placed to connect the die to parts inside of the package and outside of the die. Metal leads connect the inside of the package to external circuitry. The coupled die and lead frame can be molded in molding compound to form the completed IC package. Standard lead frames typically have the metal leads on only a single layer.

SUMMARY

An example packaged semiconductor device includes a lead frame and a semiconductor die. The semiconductor die has first and second opposing sides, and the first side of the die is mounted to the lead frame. A first set of bond wires and/or bump bonds are configured to electrically couple the die to the lead frame. A passive circuit element is on a substrate, and the substrate is mounted to the second side of the die. A second set of bond wires and/or bump bonds are configured to electrically couple the passive circuit element to the die. A molding material is configured to encapsulate the passive circuit element, the die, and at least a portion of the lead frame.

An example method of fabricating a packaged semiconductor device includes mounting a passive element, which is on a substrate, to a first side of a semiconductor die. The method also includes mounting a second side of the semiconductor die to a die pad of a lead frame, in which the second side is opposite the first side. The method also includes electrically coupling the passive element, the die, and the lead frame. The method also includes encapsulating the substrate, the die, and at least a portion of the lead frame in a molding material.

An example packaged integrated circuit includes a quad flat no-lead (QFN) or quad flat package (QFP) lead frame having a die pad and a plurality of bond pads. A semiconductor die has first and second surfaces on opposite sides of the die, in which the second surface includes bond pads and the first surface is mounted to the die pad. Bond wires or bump bonds are electrically coupled between the bond pads of the die and bond pads of the lead frame. An interdigital capacitor on a routable lead frame substrate has capacitor terminals, in which the capacitor terminals are electrically coupled to bond pads of the die, and the substrate is mounted to the second side of the die. A molding material encapsulates the capacitor device, the die, and at least a portion of the lead frame.

BRIEF DESCRIPTION OF THE DRAWINGS

FIGS. 8A through 8K are cross-sections view of an example process flow for fabrication of a passive device in a routable lead frame (RLF) substrate.

DETAILED DESCRIPTION

Electronic circuitry can make use of passive elements (also referred to as passive circuit elements) for a variety of functions, including signal filtering, noise reduction, electric power transfer, and electromagnetic signal transmission. As an example, a decoupling capacitor can be coupled to or included in an integrated circuit package that includes a semiconductor die to reduce electromagnetic interference (EMI) to less than about 10 decibels-microvolts per meter. Even where a passive element can be packaged with a semiconductor die in a conventional lead frame package, parasitic inductances, which can grow as a function of the distance between the passive element and the die, can compromise the performance of the passive element, such as the performance of a decoupling capacitor.

A substrate-on-die package (SoDP) architecture, as described herein, can include a substrate-based passive device mounted on a semiconductor die. The semiconductor die is mounted to a die pad of a lead frame, which is encapsulated to provide a packaged semiconductor device. The approach described herein can be implemented as a quad flat no-lead (QFN) or quad flat package (QFP), such as to maximize performance within manufacturing limits of such mature lead frame technologies. The substrate-based passive device can be fabricated on a substrate using a substrate fabrication technology, such as a routable lead frame (RLF), embedded trace substrate (ETS), or chip size package (CSP). The passive device can include one or more of a capacitor (e.g., an interdigital capacitor), an inductor coil, a low-pass filter, a balun, an antenna, or other passive circuit element. A packaged integrated circuit made using the SoDP architecture can achieve the performance improvement by including the passive device while still taking advantage of the manufacturing simplicity and cost-effectiveness of mature lead frame packaging technologies for mounting the semiconductor die.

Figure 1:
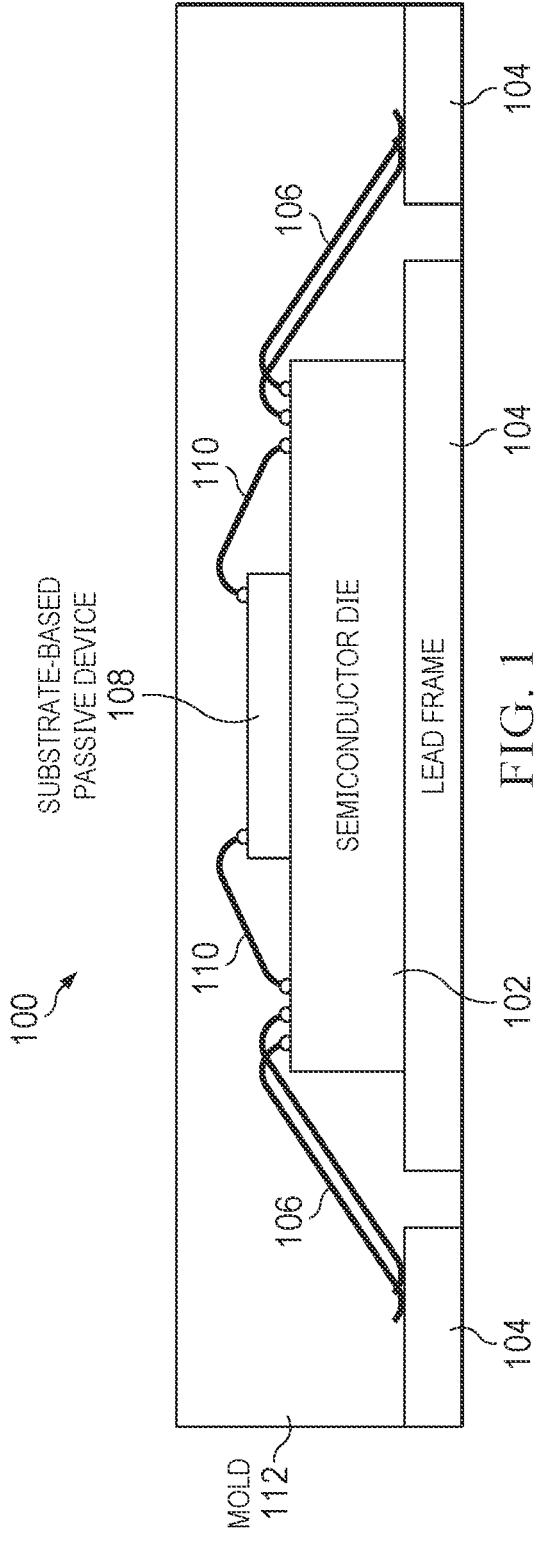
FIG. 1 is a schematic illustration of an example substrate-on-die package with a passive device mounted to a die.

FIG. 1 is a schematic diagram of an example substrate-on-die package 100. The package 100 includes a semiconductor (e.g., silicon) die 102 on which one or more circuits have been fabricated. The circuit on the die 102 thus can include an arrangement of analog or digital circuitry configured to implement circuit functions that can vary depending on application requirements. For example, the circuit(s) fabricated on the die 102 include an arrangement of one or more functional electronic circuits, such as amplifiers, data converters, interface electronics, one or more transistors, sensors, logic, power converters, controllers, transmitters, receivers, etc. In the package 100, the circuit(s) on the die 102 are configured to use one or more passive circuit elements implemented on substrate-based passive device 108, which is mounted to die 102. For example, a surface of the substrate, which includes the passive device 108, is mounted to a top surface of the die 102, thus providing the substrate-on-die package 100.

As shown in FIG. 1, the die is mounted to a lead frame 104, e.g., a QFN or QFP lead frame. One or more bond wires 106 electrically couple the die 102 to the lead frame 104. For example, the each bond wire 106 is coupled between a bond pad on a surface of the die 102 and a respective pad on the lead frame 104, which can be coupled to a terminal, such as pin or other lead. The lead frame 104 provides electrical signals and/or electrical power to and from the die 102 through the bond wires 106.

A passive substrate-based device, which includes a passive element formed on or in another substrate, is mounted to the semiconductor die 102. The passive device can be fabricated using, for example, an RLF, CSP, or ETS fabrication process. In the example of FIG. 1, the passive device 108 can be electrically coupled to the die 102 through bond wires 110, such as jumper bond wires coupled between bond pads on the passive device 108 and bond pads on the top surface of the die 102 where the device is mounted. Alternatively, the passive device 108 can be electrically coupled to the die 102 through bump bonds in a flip-chip process (not shown in FIG. 1, but see, e.g., FIG. 10). The passive device 108 can be coupled to the die 102 on a first side of the die 102 (e.g., a top of the die 102), and the die 102 can be coupled to the lead frame 104 on a second side of the die 102 (e.g., a bottom side of the die 102). For example, the first side of the die 102 and the second side of the die 102 can be opposite each other on the die 102. A molding material 112 encapsulates the passive device 108, the die 102, the bond wires 106, 110, and at least a portion of the lead frame 104. Portions of the lead frame 104 may extend outside of the molding material 112 to provide electrical leads (e.g., pins) by which the IC may be accessed.

Figure 2A:
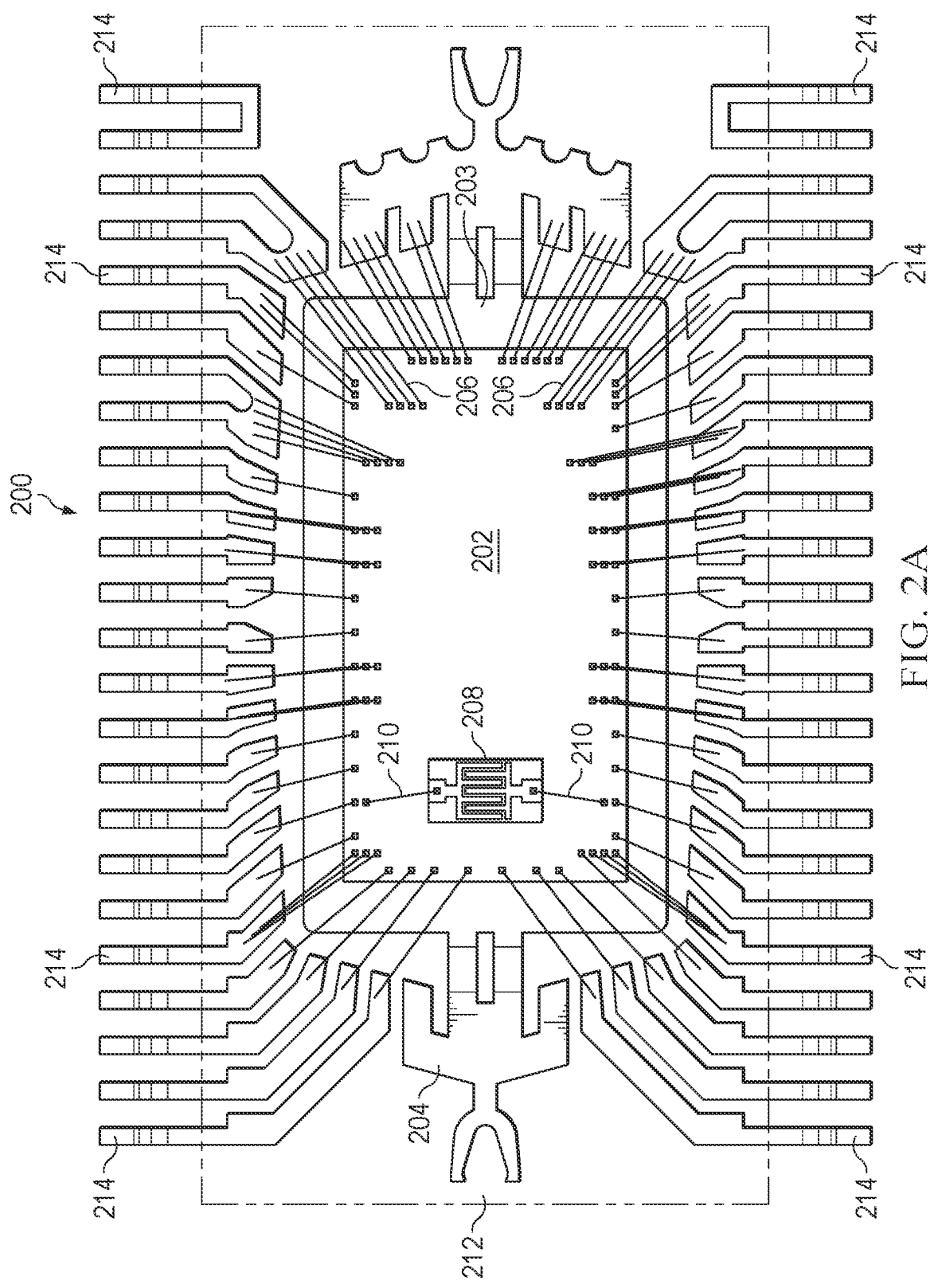
FIG. 2A is a top-down view of an example substrate-on-die package with a passive element mounted to a die.
Figure 2B:
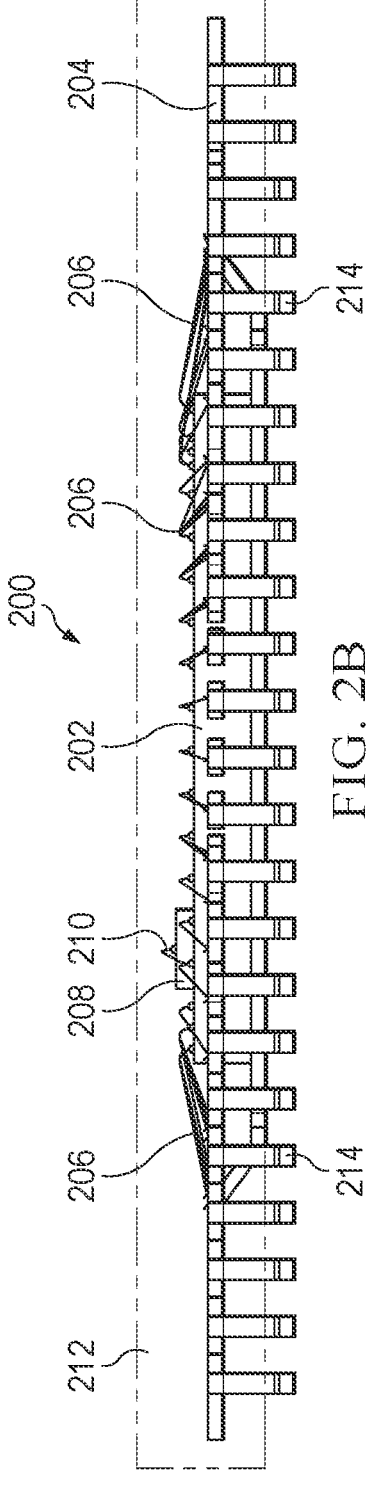
FIG. 2B is a side view of the example substrate-on-die package of FIG. 2A.
Figure 2C:
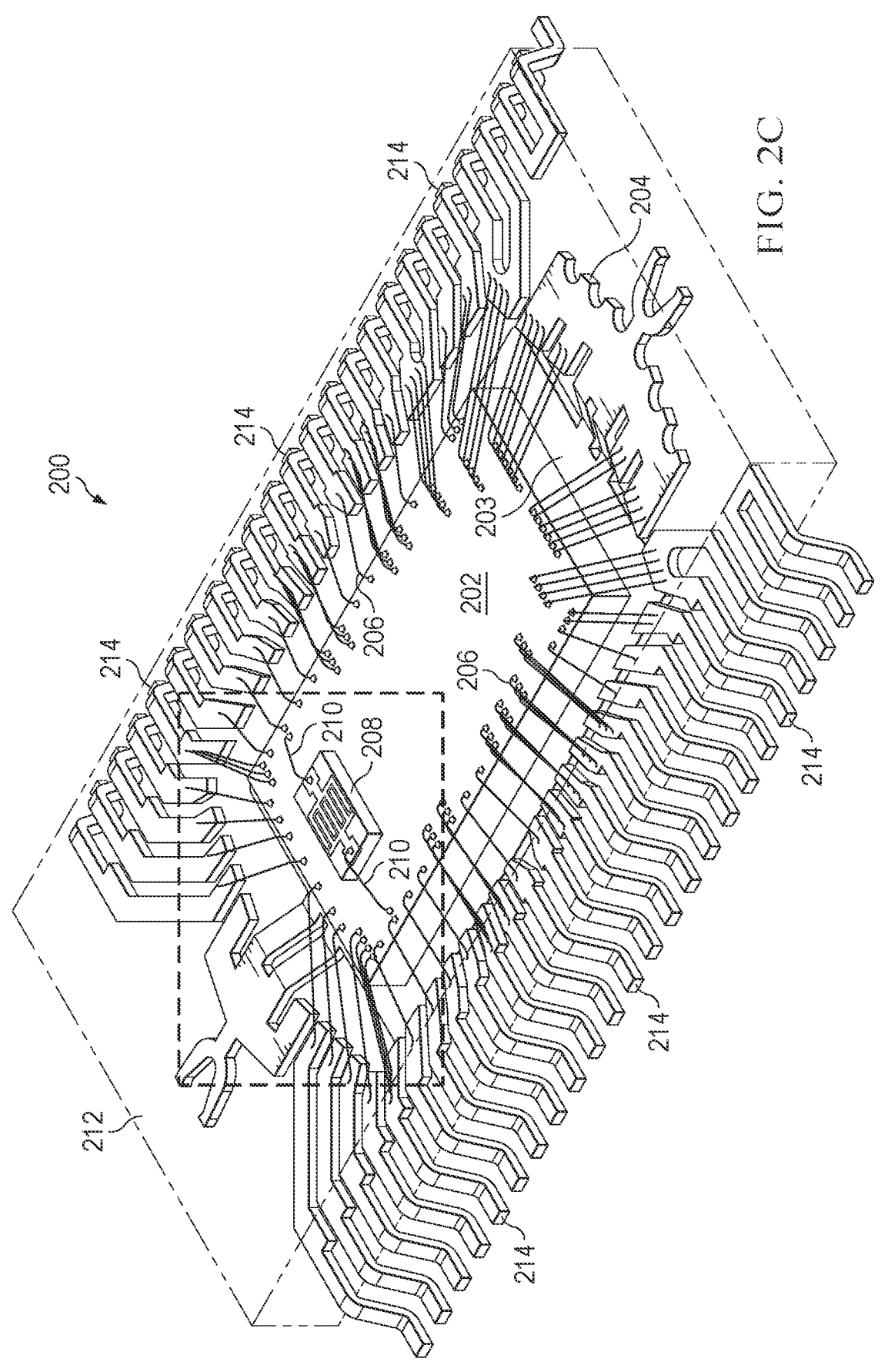
FIG. 2C is an isometric view of the example substrate-on-die package of FIG. 2A.
Figure 2D:
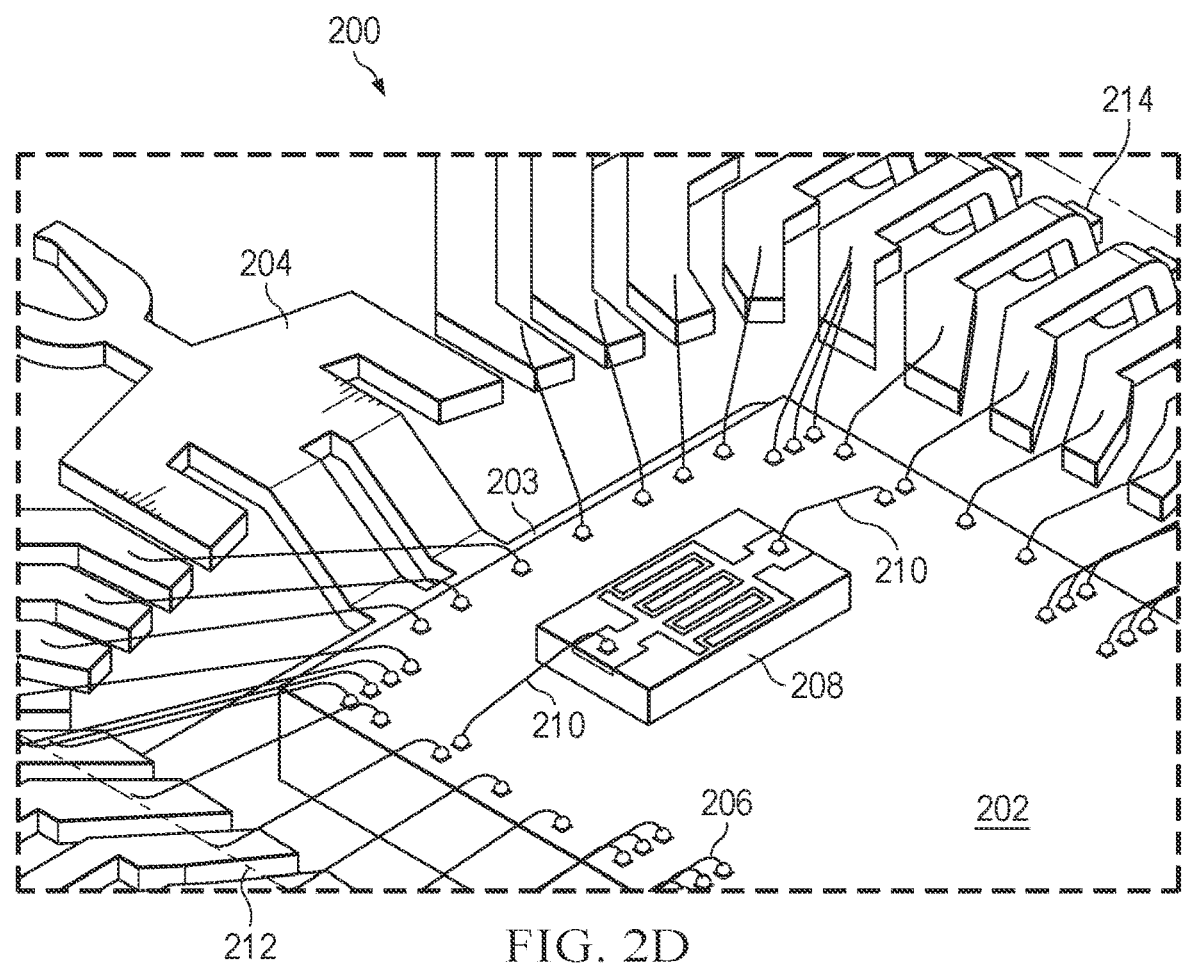
FIG. 2D is a zoomed-in view of part of the example substrate-on-die package of FIG. 2C.

FIGS. 2A through 2D show an example substrate-on-die package 200 from different views, including a top-down view (FIG. 2A), a side view (FIG. 2B), an isometric view (FIG. 2C), and a zoomed-in isometric view (FIG. 2D). A semiconductor (e.g., silicon) die 202 has one or more electronic elements (e.g., transistors or other circuitry) fabricated in it to form functional electronic circuitry, which can make use of one or more external passive elements (e.g., passive elements fabricated on one or more other substrates) external to the die 202. The die 202 is mounted to a die pad

203 of a lead frame 204, such as using a die attachment adhesive or soldering. In the example of FIGS. 2A through 2D, the lead frame 204 is configured as a thin-shrink small outline package (TSSOP) lead frame. Other types of lead frames can be used in other examples (e.g., other small outline packages, flat packages. ball grid array packages, etc.). The package 200 includes bond wires 206 configured to electrically couple the die 202 to the lead frame 204. For example, a top surface of the die 202 includes bond pads and the bond wires 206 electrically couple the die bond pads with respective bond pads of the lead frame 204.

A substrate-based passive device 208, which includes a passive element fabricated on a substrate, is mounted to a top surface of semiconductor die 202. In the example of FIGS. 2A-2D, the passive device 208 includes a capacitor, such as an interdigital fabricated on multiple substrate layers using an RLF fabrication process. In other examples, the passive element of the device 208 is a different kind of passive element, which can be fabricated using an RLF, CSP or ETS fabrication process. In the example of FIG. 2, the passive device 208 is electrically coupled to the die 202 through bond wires 210, such as jumper bond wires coupled between bond pads on the passive device 108 and respective bond pads on the top surface of the die 102. Alternatively, the passive device 108 can be electrically coupled to the die 102 through bump bonds (not shown in FIG. 1, but see, e.g., FIG. 10), such as using a flip-chip packaging process technology. The passive device 208 is coupled to the top of the die 202, such as using an adhesive material or soldering, while the die 202 is coupled to the lead frame 204 on the bottom of the die 202. A molding material 212 encapsulates the passive device 208, the die 202, the bond wires 206, 210, and a portion of the lead frame 204. Portions of the lead frame 104 can extend outside of the molding material 212, such as to expose leads (e.g., pins) 214.

As described herein, the passive device 108 of FIG. 1 can be any of a variety of different types of passive element, including capacitive and inductive elements, filters, baluns, or antennas. FIGS. 3A through 7 illustrate additional useful examples of different types of passive elements fabricated on respective substrates, which can be used in the substrate-on-die package architecture described herein including FIGS. 1 and 2A-2D.

Figure 3A:
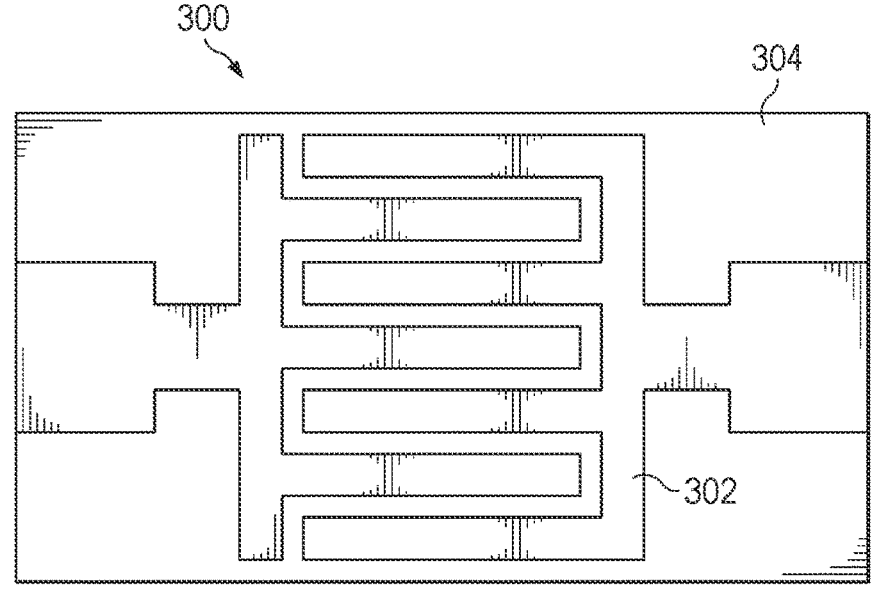
FIG. 3A is a top-down view of an example interdigital capacitor fabricated on a substrate.
Figure 3B:
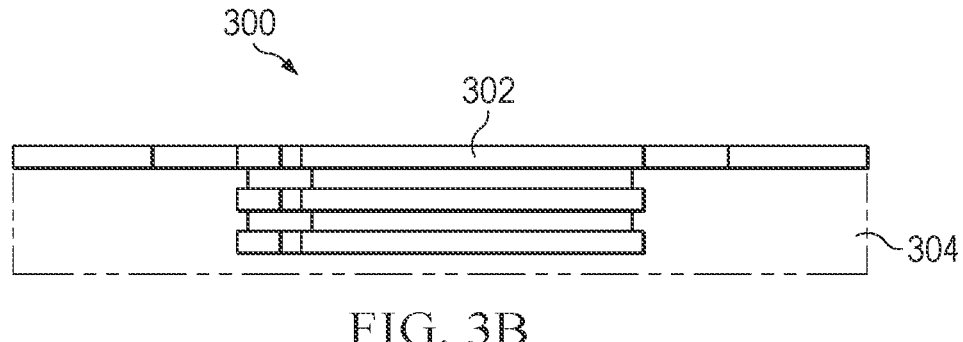
FIG. 3B is a cross-sectional side view of the example interdigital capacitor of FIG. 3A.
Figure 3C:
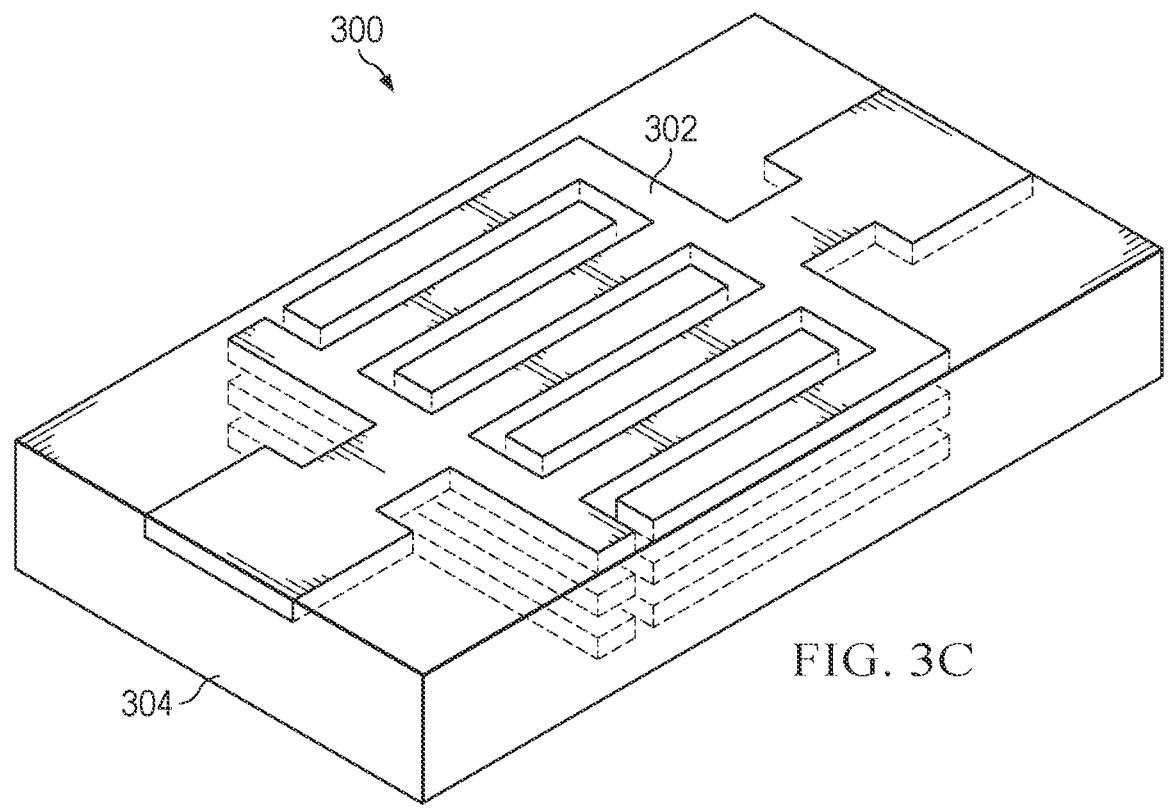
FIG. 3C is an isometric view of the example interdigital capacitor of FIG. 3A.

FIGS. 3A through 3C show an example interdigital capacitor 300 fabricated on a substrate in a top-down view (FIG. 3A), a side-view cross-section (FIG. 3B), and an isometric view (FIG. 3C). The interdigital capacitor 300 can be fabricated, for example, with an RLF fabrication process, such as the one set forth in greater detail in U.S. patent application Ser. No. 17/838,797, which is incorporated herein by reference in its entirety. The RLF process provides the advantage that respective fingers of the interdigital capacitor can be fabricated using traces across a number of layers. In other examples, the interdigital capacitor can be fabricated with an ETS or CSP fabrication process. Fingers of the interdigital capacitor are formed by conductive traces 302 of a metal such as copper, aluminum, or gold. The traces 302 are set in a dielectric mold material 304 that can be a build-up film such as Ajinomoto Build-up Film (ABF) interlayer insulating materials, a pre-preg material (a fiber weave or cloth, e.g., of glass fibers, pre-impregnated with a bonding agent, e.g., an epoxy or phenolic resin material), or an epoxy material (e.g., a molding compound epoxy).

Figure 4A:
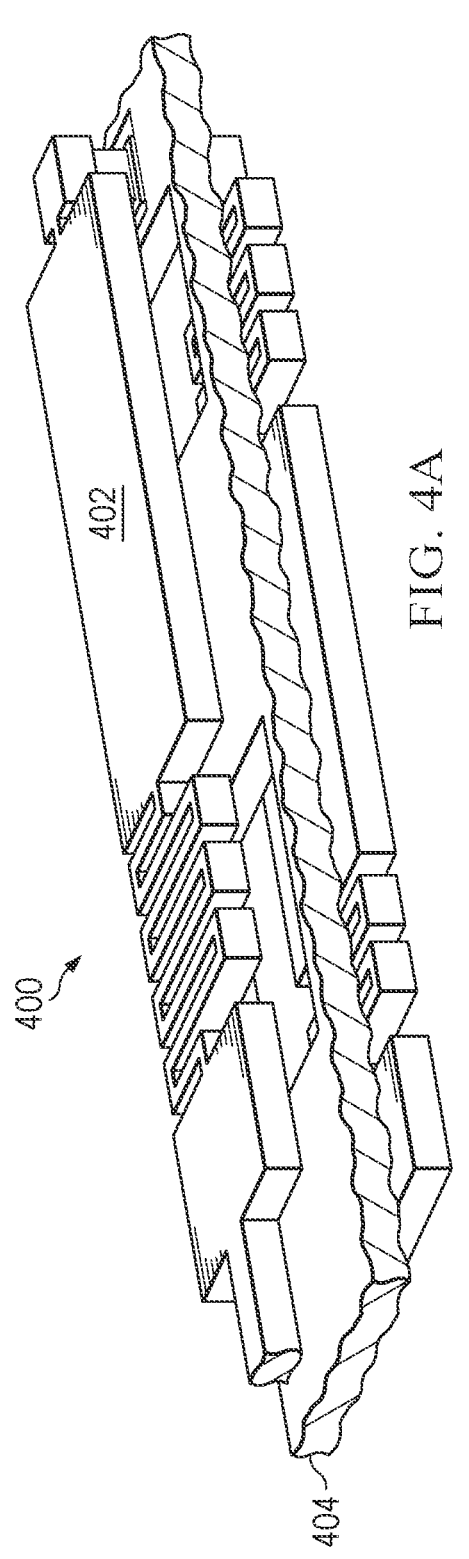
FIG. 4A is an isometric view of an example low-pass filter module fabricated on a substrate.
Figure 4B:
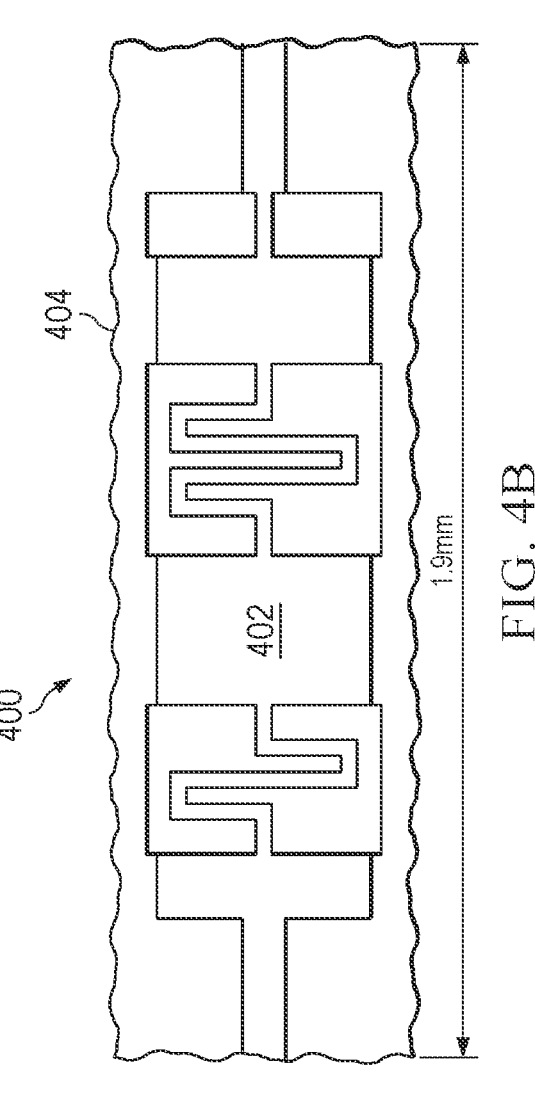
FIG. 4B is a top-down view of the example low-pass filter module of FIG. 4A.

FIGS. 4A and 4B show an example a low-pass filter (LPF) module 400 fabricated on a substrate in an isometric view (FIG. 4A) and a top-down view (FIG. 4B). The LPF module 400 can be fabricated with an RLF, ETS, or CSP fabrication process. The LPF module 400 an include, for example, capacitive and resistive elements fabricated out of different layers of conductive material 402, e.g., a metal such as copper, aluminum, or gold. The conductive material 402 can be set in a dielectric mold material 404 that can be a build-up film such as ABF, a pre-preg material, or an epoxy. The LPF module 402 can be used, for example, in circuitry providing a high speed serializer/deserializer (serdes) or an amplifier. The passive element can be similarly configured as other types of filter modules, such as high-pass filter or band-pass filter modules.

Figure 5:
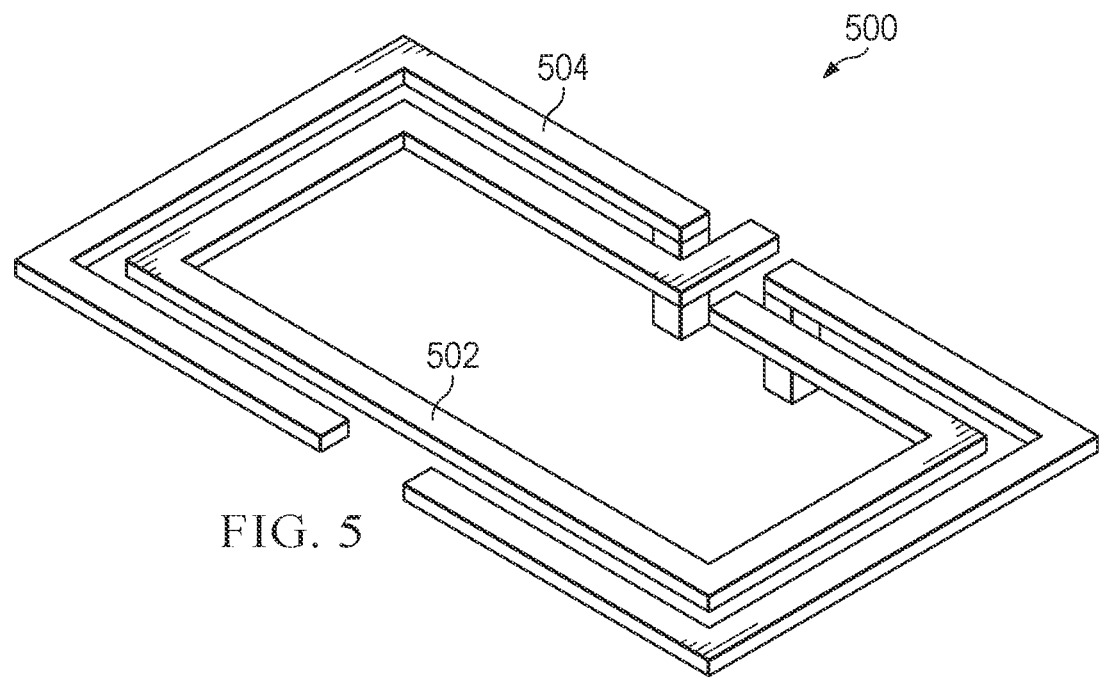
FIG. 5 is an isometric view of an example balun fabricated on a substrate.

FIG. 5 shows example balun 500 fabricated on a substrate. The balun 500 can include different conductive traces 502, 504 configured to circumscribe each other. The balun 500 can be fabricated on a substrate (not shown) with an RLF, ETS, or CSP fabrication process. The balun 500 can be used, for example, in conjunction with circuitry on a semiconductor die (e.g., die 102, 202) configured to implement radio frequency (RF) circuit functionality.

Figure 6:
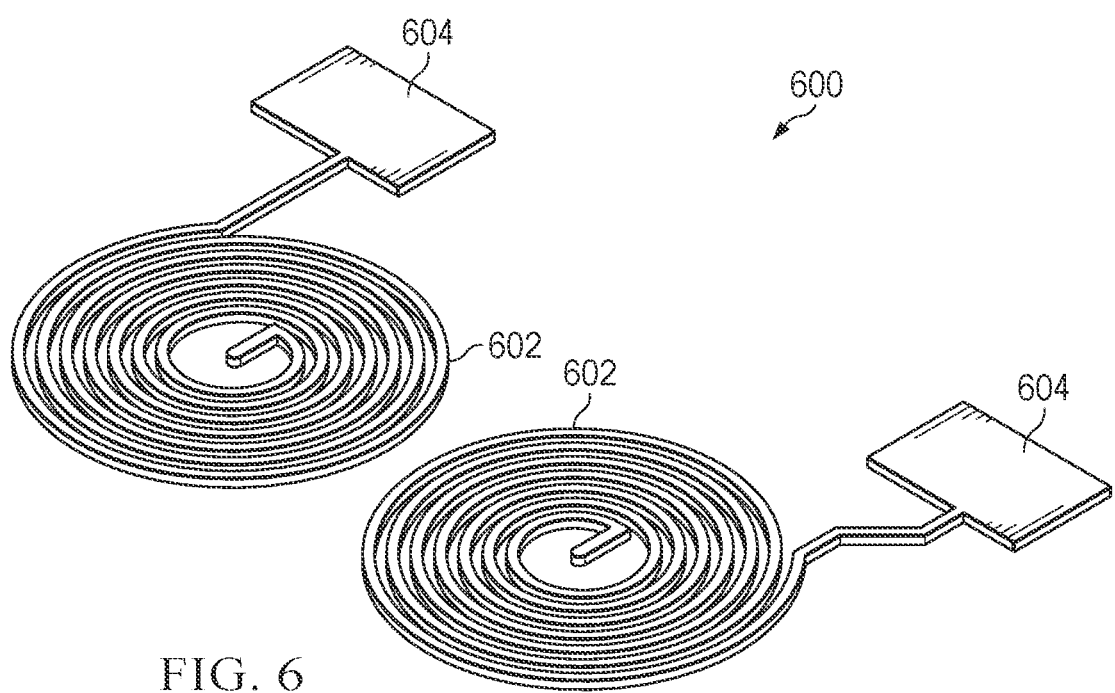
FIG. 6 is an isometric view of an example inductor coil module fabricated on a substrate.

FIG. 6 shows an example inductor coil module 600, which can be fabricated on a substrate, as described herein. The inductor coil module 600 can include one or more conductive coils 602 coupled to one or more terminals or bond pads 604. The inductor coil module 600 can be fabricated with an RLF, ETS, or CSP fabrication process. The inductor coil module 600 can be used, for example, in conjunction with circuitry on a semiconductor die (e.g., die 102, 202) configured, for example, to include power converter circuitry.

Figure 7:
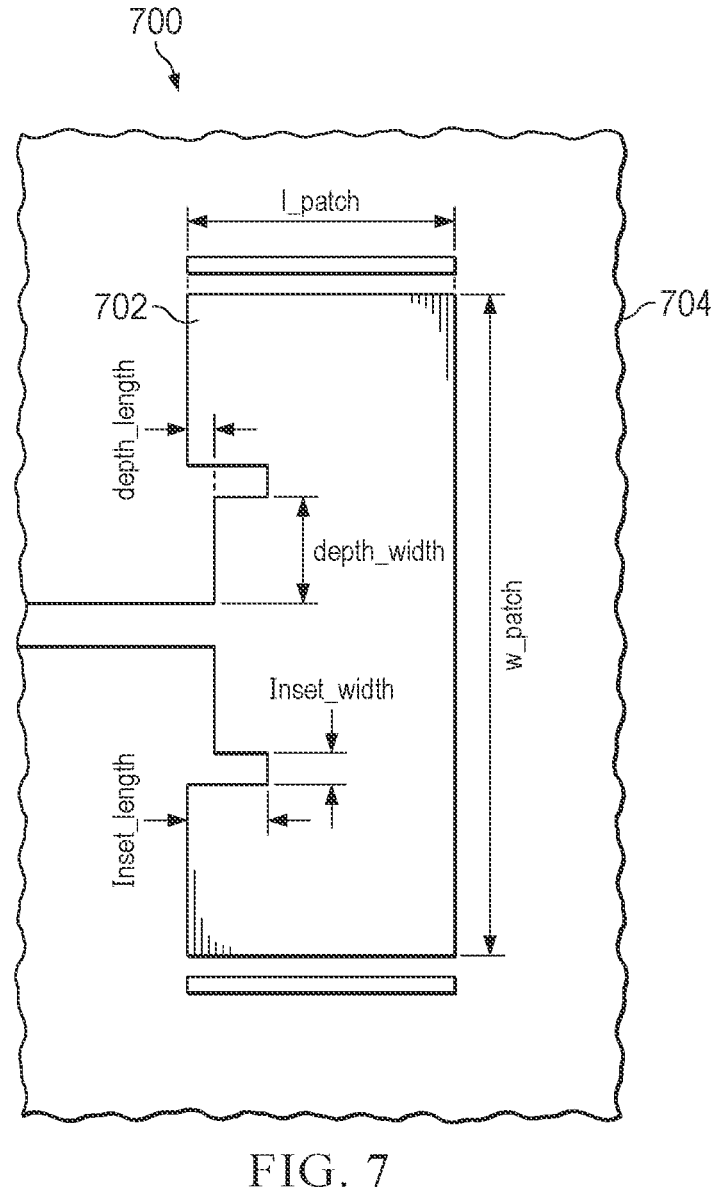
FIG. 7 is a top-down view of an example antenna module fabricated on a substrate.

FIG. 7 shows an example antenna module 700 fabricated on a dielectric substrate 704. The antenna module 700 can include one or more conductive antenna elements 702 set in or the dielectric substrate 704. The antenna module 700 can be fabricated with an RLF, ETS, or CSP fabrication process configured in a desired size and shape according to application requirements. For example, the antenna module 700 can be a patch antenna, a slot-bowtie antenna, or other types of antennas. In some examples, the antenna module 700 can include an arrangement of multiple patch antennas on the same substrate to provide a microstrip antenna, which can be used to provide high gain array antennas, and phased arrays in which a beam can be electronically steered. The antenna module 700 can be mounted to an IC die (e.g., die 102, 202) to provide a millimeter-wave antenna-on-package sensor.

FIGS. 8A through 8K depict an example process flow 800 that can be used to fabricate showing a passive element in an RLF substrate, such as can be used to provide a substrate-based passive device described herein (see, e.g., FIGS. 1-7). The example process flow 800 of FIGS. 8A through 8K shows the progressive formation of a substrate-based passive device in cross-sectional views. The example manufacturing process flow can be used to provide single-layer or multi-layer passive devices (e.g., passive devices 108, 208, 300, 400, 500, 600, or 700) fabricated in an RLF substrate.

Figure 8A:
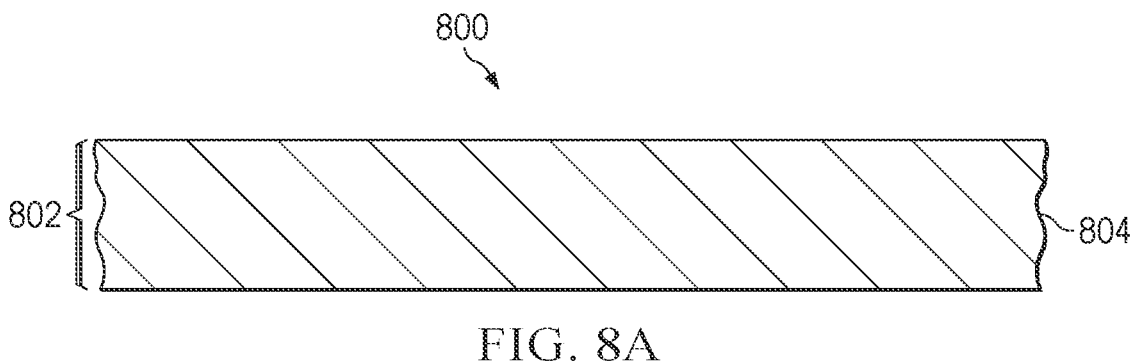
Figure 8B:
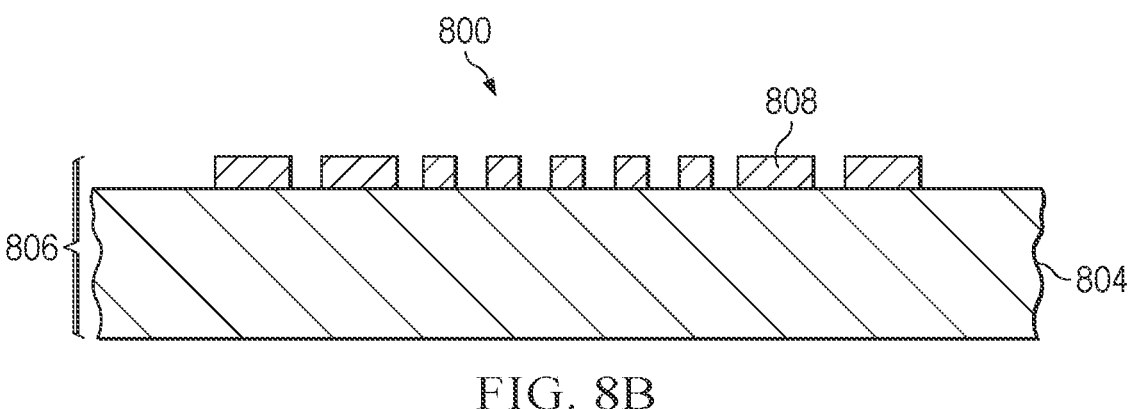

In FIGS. 8A and 8B, cross-sections 802 and 806 show formation of a first patterned conductive layer 808 (e.g., of copper, aluminum, or gold) on a metal carrier 804 (e.g., stainless steel). The metal carrier 804 serves as a base layer (e.g., a sacrificial substrate) that is removed before the conclusion of the fabrication process. The first patterned conductive layer 808 can correspond to any of layers 302, 402, 502, 504, 602, 604, or 702 in any of the above-described passive devices. The first patterned conductive layer 808 can include, for example, interdigital capacitor fingers, such as described herein. The formation of the first patterned conductive layer 808 on the carrier 804 can include depositing a thin seed layer of the conductive material to be used for forming the patterned conductive layer 808. For example, the patterned conductive layer 808 can be formed by patterning and developing a first photoresist material layer (e.g., a photolithographic mask, not shown) on the carrier 804 to expose first openings in the first photoresist material layer. The seed layer can be etched to retain a patterned portion of the seed layer having the contour of the patterned conductive layer 808 (including, e.g., interdigital capacitor fingers and/or terminals, or other passive element conductive portions). The first photoresist material layer over the retained patterned portion of the seed layer can be stripped and additional conductive material can be formed (e.g., by electroplating or depositing) on top of the retained patterned portion of the seed layer to increase the thickness of the conductive material approximately within the contours of the retained patterned portion of the seed layer.

Figure 8C:
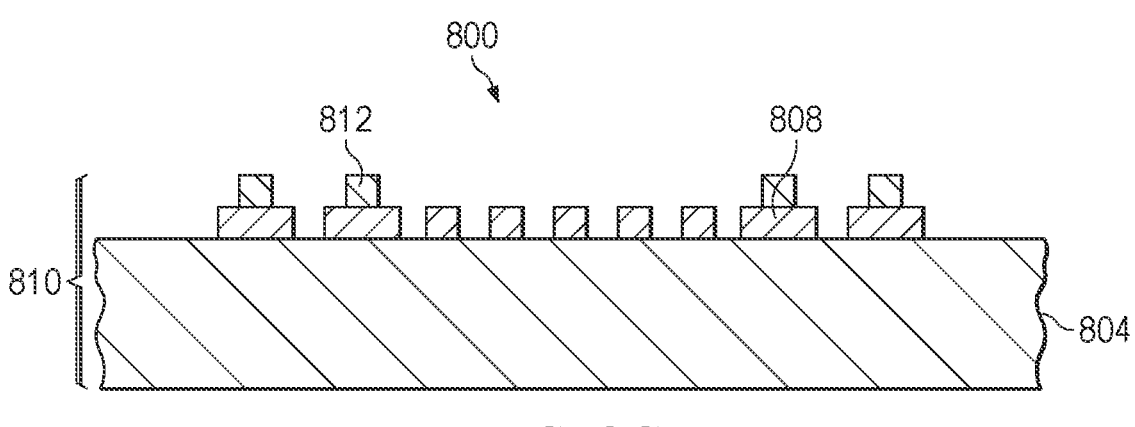

In FIG. 8C, cross-section 810 shows formation of a first via layer 812 (e.g., of copper, aluminum, or gold) on, and wholly within the two-dimensional pattern contours of, the first patterned conductive layer 808. Like the first patterned conductive layer 808, the first via layer 812 is also a patterned conductive layer. First via layer 812 can be formed, for example, by patterning and developing a second photoresist material layer (not shown) on the carrier 804 and over portions of the first patterned metal layer 808 to expose second openings in the second photoresist material layer, and forming (e.g., electroplating or depositing) first via layer 812 on the first patterned conductive layer 808 in the second openings of the second photoresist material layer. The second photoresist material layer can then be stripped. The two-dimensional contours of the pattern of the first via layer 812, as viewed in a top-down view orthogonal to the view of FIG. 8C, can have any shape that is within the bounds of the two-dimensional contours of the pattern of the first patterned conductive layer 808, and are not limited, for example, to a disjointed array of circular or small-aspect-ratio shapes. In some examples, the two-dimensional contours of the pattern of the first via layer 812 form one or more continuous wall, L, or comb shapes when viewed in a top-down view (orthogonal to the views of FIGS. 8C-8K). For example, the first via layer 812 can comprise a wall, L-shape, comb or other continuous features having a desired length (e.g., at least 100 micrometers, such as at least 300 micrometers or at least 500 micrometers), which can be longer and/or have shapes not practicable with other fabrication process technologies.

Figure 8D:
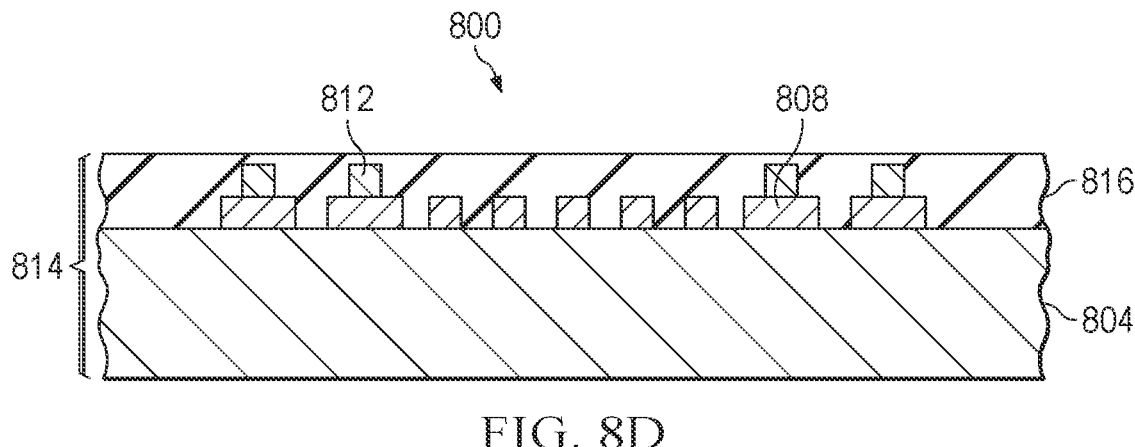
Figure 8E:
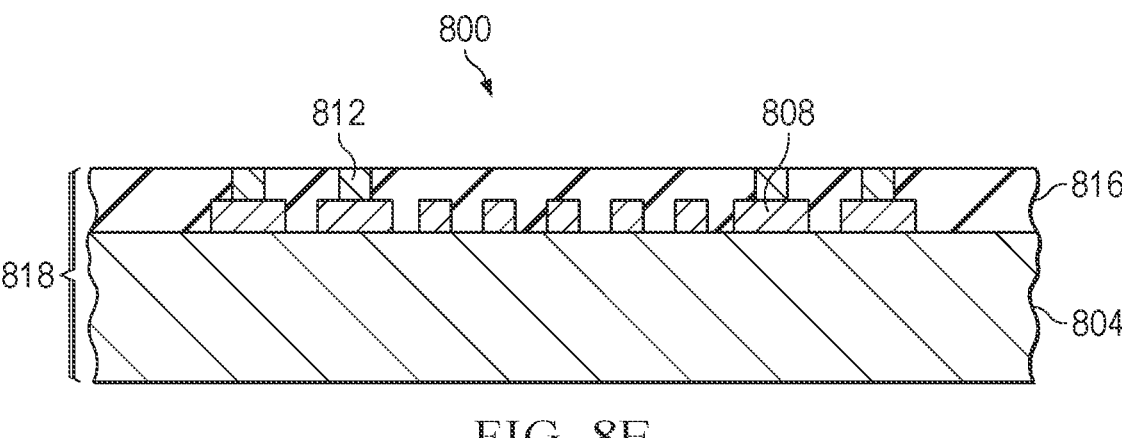

In FIGS. 8D and 8E, cross-sections 814 and 818 show the result of a first molding process, e.g., molding and grinding, that results in a first dielectric mold material 816 covering the first patterned conductive layer 808 and the first via layer 812 in a way that exposes surfaces of the first via layer 812. As an example, the first dielectric mold material 816 can be a build-up film such as Ajinomoto Build-up Film (ABF) interlayer insulating materials. As another example, the first dielectric mold material 816 can be a pre-preg material, which is a fiber weave or cloth (e.g., of glass fibers) pre impregnated with a bonding agent (e.g., an epoxy or phenolic resin). As yet another example, the first dielectric mold material 816 can be an epoxy (e.g., a mold compound epoxy). In the molding of the first molding process, the result of which is shown in cross-section 814, a first dielectric layer 816 is formed over the first patterned conductive layer 808 and the first via layer 812. For example, the first dielectric layer 816 can be compression molded over the first patterned conductive layer 808 and the first via layer 812.

The first dielectric layer 816 can be ground down to expose surfaces of the first via layer 812, the result of which is shown in cross-section 818.

Figure 8F:
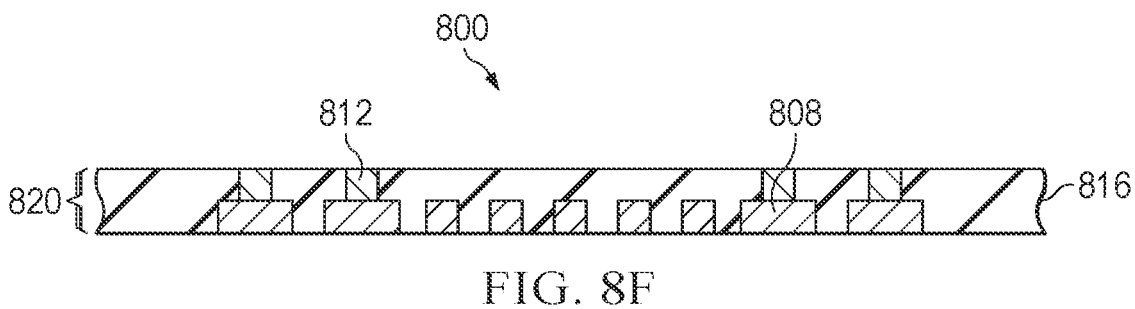

In FIG. 8F, cross-section 820 shows the result of a de-carrier portion of the RLF fabrication process in which the carrier 804 is removed from the dielectric layer 816 and the conductive layers 808, 812, e.g., by dislodging the carrier 804 from the dielectric layer 816 and the conductive layers 808, 812 through a combination of a chemical etch process and a mechanical process. The conductive layers 808, 812 and the first dielectric layer 816 remain intact with each other and form a single-layer RLF passive device. As described above with regard to FIGS. 1 and 2A through 2D and below with regard to FIG. 10, an IC die 102, 202, or 1002 can subsequently be attached to a surface of the first dielectric layer 816, where the die 102, 202, or 1002 can include contacts on the surface of the die 102, 202, or 1002 that is attached to the first dielectric layer 816. The contacts are aligned with and conductively coupled to exposed surfaces of the first via layer 812. A molding material 112, 212 can then be formed over the die 102, 202, or 1002, the first dielectric layer 816, the first patterned metal layer 808, and the first via layer 812.

In some examples, a multi-layer passive device can be fabricated by substantially repeating the conductive layer formation, molding, and grinding steps described above as many times as desired before removing the carrier 804. In FIGS. 8G, 8H, 8I, 8J, and 8K, cross-sections 856, 860, 864, 868, and 870 illustrate a continuation of the example process of RLF fabrication from the cross-section 818 to form a two-layer passive device, shown in cross-section 870. In other examples, a three-layer passive device, or a passive device with a greater number of layers, can be fabricated by repeating the same fabrication actions a number of times commensurate with the desired number of layers.

For example, cross-section 856 in FIG. 8G shows formation of a second patterned conductive layer 858 (e.g., of copper, aluminum, or gold) on the first via layer 812 and the first dielectric layer 816, as part of the device progression shown in cross-section 818 of FIG. 8E. The second patterned conductive layer 858 can correspond, for example, to any layer 302, 402, 502, 504, 602, 604, or 702 in any of the above-described passive devices. The second patterned conductive layer 858 can include, for example, one or more interdigital capacitor fingers. The formation of the second patterned conductive layer 858 on the first via layer 812 and the first dielectric layer 816 can, for example, include patterning and developing a third photoresist material layer (not shown) on the first dielectric layer 816 to expose third openings in the third photoresist material layer. A pattern (e.g., including interdigital capacitor fingers and/or terminals) can be formed (e.g., electroplating) on the first dielectric layer 816 in the third openings of the third photoresist material layer, and the third photoresist material layer can be stripped in a third etching process.

In FIG. 8H, cross-section 860 shows depositing of a second via layer 862 (e.g., of copper, aluminum, or gold) on the second patterned conductive layer 858. The second via layer 862 is also a patterned conductive layer and can be formed similarly to first via layer 812. For example, a fourth photoresist material layer (not shown) can be patterned and developed on the first dielectric layer 816 and over portions of the second patterned metal layer 858 to expose fourth openings in the fourth photoresist material layer. The second via layer 862 can be formed (e.g., by electroplating or depositing) on the second patterned conductive layer 858 in the fourth openings of the fourth photoresist material layer.

The fourth photoresist material layer can then be stripped. The two-dimensional contours of the pattern of the second via layer 862, as viewed in a top-down view orthogonal to the view of FIG. 8H, can have any shape that is within the bounds of the two-dimensional contours of the pattern of the second patterned conductive layer 858, and are not limited, for example, to a disjointed array of circular or small-aspect-ratio shapes. In some examples, the two-dimensional contours of the pattern of the second via layer 862 form one or more continuous wall, L, or comb shapes when viewed in a top-down view (orthogonal to the views of FIGS. 8H-8K). For example, the second via layer 862 can comprise a wall, L, or comb that is continuous over a desired length, which can exceed 100 micrometers.

Figures 8J, 8K:
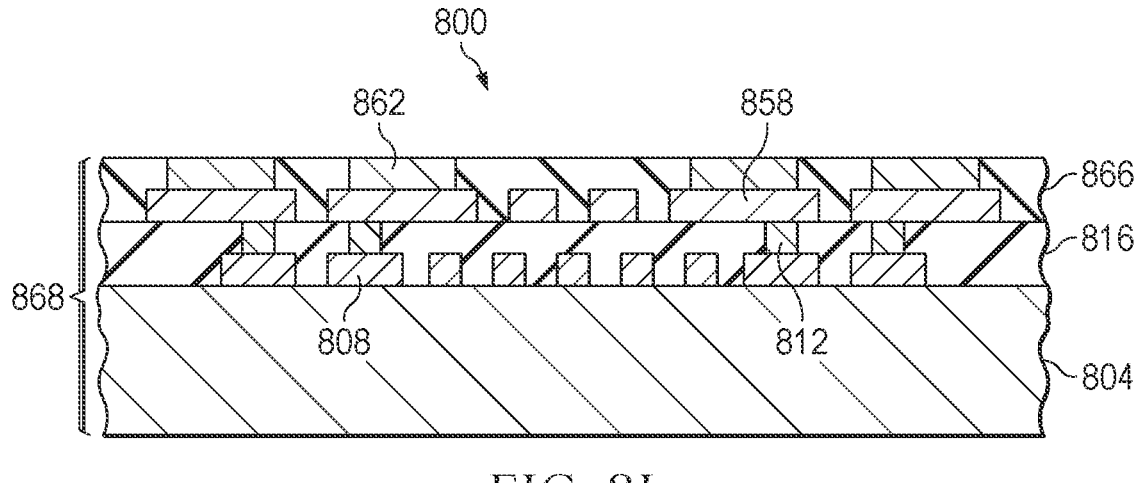

In FIGS. 8I and 8J, cross-sections 864 and 868 show the result of a second molding process, e.g., molding and grinding, in which a second layer of dielectric mold material 866 is formed over the first dielectric mold material 816, the second patterned conductive layer 858, and the second via layer 862 in a way that exposes surfaces of the second via layer 862. For example, the second dielectric layer 866 is compression molded over the first dielectric mold material 816, the second patterned conductive layer 858 and the second via layer 862. The second dielectric mold material 866 can be, for example, ABF, a pre-preg material, or an epoxy. The second dielectric layer 866 can be ground down to expose surfaces of the second via layer 862, such as shown in cross-section 868.

In FIG. 8K, cross-section 870 shows the result of a de-carrier portion of the RLF fabrication process in which the carrier 804 is removed from the dielectric layers 816, 866 and the conductive layers 808, 812, 858, 862. For example, the carrier 804 can be removed from the dielectric layers 816, 866 and the conductive layers 808, 812, 858, 862 through a combination of a chemical etch process and a mechanical process. The conductive layers 808, 812 and the first and second dielectric layers 816, 866 remain intact with each other and form, at this point, a two-layer passive element. A three-layer passive element device or a passive device with a greater number of layers can be fabricated on or in respective substrate layers by repeating the same fabrication actions more times than shown in FIGS. 8A through 8K before remove the carrier layer.

A benefit of using an RLF fabrication process, such as the process shown in FIGS. 8A through 8K, to make a multi-layer passive element, as compared to either a laminated substrate process or a ball-grid-array (BGA) process, is that the RLF fabrication process does not require formation of a plated through-hole (PTH) or a laser-drilled blind via. In an RLF fabrication process, the conductive structural features of the passive element are built up layer-by-layer, with the advantage that the one or more via layers do not need to be circular or low-aspect-ratio in shape. The via layer(s) can be any continuous shape of conductive material, including rectangular, L-shaped, or a fingered comb shape (as shown). Any-shaped vias are not possible using a laser-drilled laminated substrate fabrication process technology.

Figure 9:
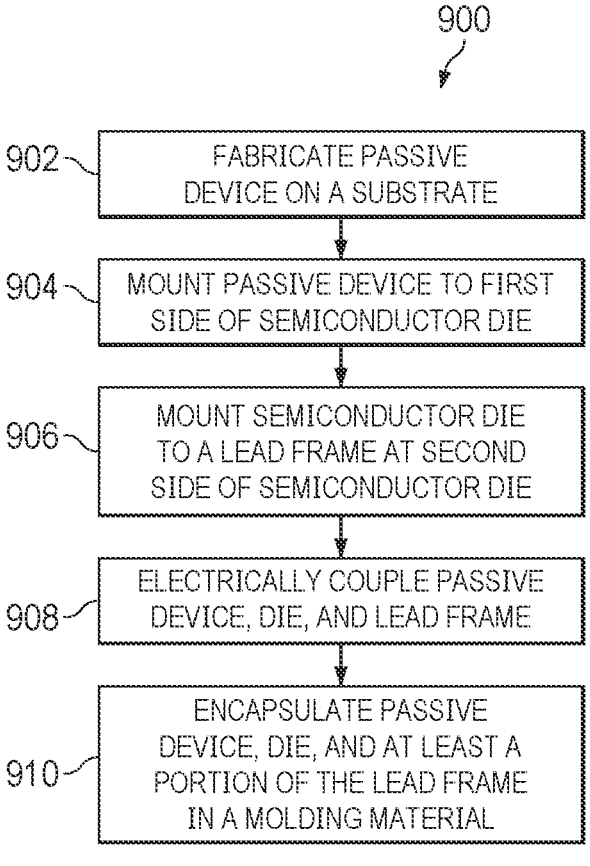
FIG. 9 is a flow chart of an example method of fabricating a substrate-on-die package using passive circuitry.

FIG. 9 shows an example method 900 of fabricating a substrate-on-die package. At 902, the method 900 includes fabricating a passive device on a substrate. For example, the passive device can be the passive device 108 or 208, such as any of passive devices 300, 400, 500, 600, or 700. The passive device can be fabricated, for example, by an RLF, CSP, or ETS fabrication process, which allows the passive circuit element to be formed across one or more discrete layers. At 904, the passive device is mounted to a first side of a semiconductor die. For example, the die corresponds to die 102 or 202, as described with respect to FIG. 1 or 2. At 906, the die is mounted to a lead frame, such as by attaching a second side of the die to a die pad of the lead frame (e.g., using an adhesive or soldering). Although method 900 depicts the passive device substrate being mounted to the die (at 904) before the die is mounted to the lead frame (at 906), these two actions can happen in any order. For example, the die can mounted to the lead frame after the passive device is mounted on the die, in which a multi-device structure of the passive device mounted to the die is attached to a die pad of the lead frame. At 908, the passive element, the die, and the lead frame are electrically coupled by bond wires or bump bonds. In examples where the passive element is coupled to the die via bump bonds, this coupling can happen concurrently with the mounting (at 904) of the passive device to the die. At 910, the substrate, the die, and at least a portion of the lead frame are encapsulated in a molding material (e.g., an epoxy or plastic material) to provide a packaged semiconductor device, such as described herein (see, e.g., FIGS. 1 through 2D and 10). By fabricating the passive element with an RLF, ETS, or CSP substrate fabrication method, the passive element can be mounted directly to a surface of the die, which can reduce parasitic inductance typically associated with coupling the passive element to the die at a greater distance.

Figure 10:
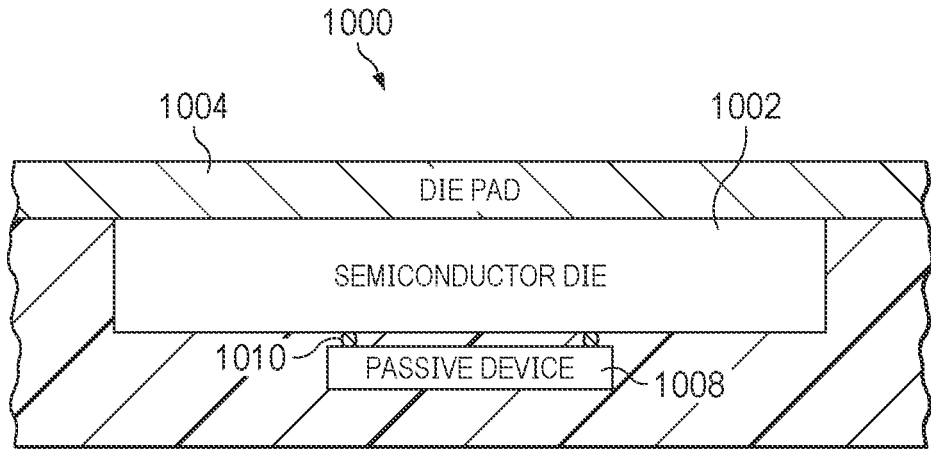
FIG. 10 is a cross-sectional side view of a passive device coupled to a semiconductor die using a flip-chip coupling and bump bonds.

FIG. 10 shows a portion 1000 of a packaged integrated circuit, in which a substrate-based passive device 1008 is coupled to a semiconductor die 1002. For example, the passive device 1008 is coupled to the die 1002 using a flip-chip coupling and bump bonds 1010. The die 1002 is mounted to a die pad 1004 of a lead frame, which can be as illustrated in FIG. 1 or 2A-2D. The die 1002 can be implemented as any of the die 102 or 202 described herein. Similarly, the passive device can be the passive device 108 or 208, such as any of passive devices 300, 400, 500, 600, or 700 described herein.

As described herein, a substrate-on-die package architecture can eliminate or mitigate the parasitic inductances associated with bond wire inductances by placing a passive device, which is fabricated on a substrate, directly on a semiconductor die. In the example of FIG. 10, in which the substrate-based passive device 1008 is flip-chip bump-bonded to a surface of the die 1002, wire bonding from the passive device to the die can be eliminated.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A packaged semiconductor device comprising:
a lead frame;
a semiconductor die having first and second opposing sides, the first side of the die mounted to the lead frame;
a first set of bond wires and/or bump bonds configured to electrically couple the die to the lead frame;
a substrate-based passive circuit element mounted to the second side of the die;
a second set of bond wires and/or bump bonds configured to electrically couple the passive circuit element to the die; and
a molding material configured to encapsulate the passive circuit element, the die, and at least a portion of the lead frame.

2. The packaged semiconductor device of claim 1, wherein the lead frame is a quad flat no-lead (QFN) or quad flat package (QFP) lead frame.

3. The packaged semiconductor device of claim 1, wherein the substrate-based passive circuit element is a routable lead frame (RLF) substrate.

4. The packaged semiconductor device of claim 1, wherein the substrate-based passive circuit element is an embedded trace substrate (ETS).

5. The packaged semiconductor device of claim 1, wherein the substrate-based passive circuit element is a chip size package (CSP) substrate.

6. The packaged semiconductor device of claim 1, wherein the substrate-based passive circuit element includes an interdigital capacitor.

7. The packaged semiconductor device of claim 1, wherein the substrate-based passive circuit element includes a low-pass filter.

8. The packaged semiconductor device of claim 1, wherein the substrate-based passive circuit element includes a balun.

9. The packaged semiconductor device of claim 1, wherein the substrate-based passive circuit element includes an antenna.

10. The packaged semiconductor device of claim 1, wherein the substrate-based passive circuit element is an inductor coil on the substrate.

11. A method of fabricating a packaged semiconductor device, the method comprising:
mounting a substrate-based passive circuit element to a first side of a semiconductor die;
mounting a second side of the semiconductor die to a die pad of a lead frame, the second side being opposite the first side;
electrically coupling the substrate-based passive circuit element, the die, and the lead frame; and encapsulating the substrate-based passive circuit element, the die, and at least a portion of the lead frame in a molding material.

12. The method of claim 11, further comprising fabricating the substrate-based passive circuit element on the substrate.

13. The method of claim 12, wherein the fabricating the substrate-based passive element comprises fabricating the substrate-based passive circuit element on a routable lead frame (RLF) substrate.

14. The method of claim 12, wherein the fabricating the substrate-based passive circuit element comprises fabricating the passive circuit element on an embedded trace substrate (ETS).

15. The method of claim 12, wherein the fabricating the substrate-based passive circuit element comprises fabricating the substrate-based passive circuit element on a chip size package (CSP) substrate-based passive circuit element.

16. The method of claim 11, wherein the substrate-based passive circuit element includes an interdigital capacitor on the substrate-based passive circuit element.

17. The method of claim 11, wherein the substrate-based passive circuit element includes a low-pass filter formed on the substrate-based passive circuit element.

18. The method of claim 11, wherein the substrate-based passive circuit element includes a balun formed on the substrate-based passive circuit element.

19. The method of claim 11, wherein the substrate-based passive circuit element includes an antenna formed on the substrate-based passive circuit element.

20. The method of claim 11, wherein the substrate-based passive circuit element includes an inductor coil formed on the substrate-based passive circuit element.

21. A packaged semiconductor device comprising:
a quad flat no-lead (QFN) or quad flat package (QFP) lead frame having a die pad and a plurality of bond pads;
a semiconductor die having first and second surfaces on opposite sides of the die, in which the second surface includes bond pads and the first surface is mounted to the die pad;
bond wires or bump bonds electrically coupled between the bond pads of the die and bond pads of the lead frame;
an interdigital capacitor having capacitor terminals on a routable lead frame substrate, in which the interdigital capacitor terminals are electrically coupled to bond pads of the die and the substrate is mounted to the second side of the die; and
a molding material encapsulating the inter-digital capacitor device, the die, and at least a portion of the lead frame.

* * * * *